May 9, 1950 R. A. GULL 2,506,869
SIGNAL-SEEKING RECEIVER
Filed June 7, 1946
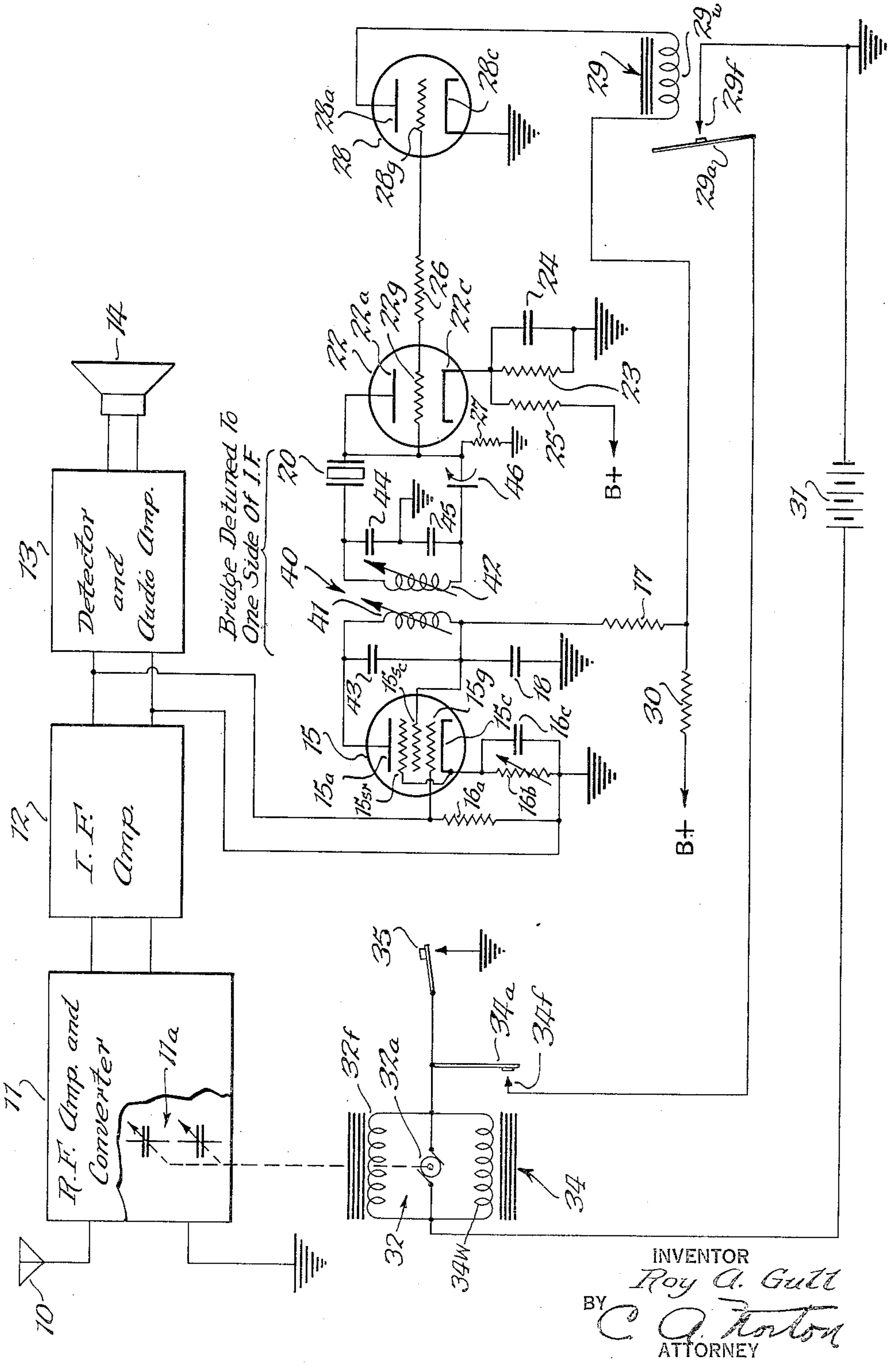
INVENTOR
Roy A. Gull
BY C. A. Horton
ATTORNEY Patented May 9, 1950

2,506,869

UNITED STATES PATENT OFFICE 2,506,869

SIGNAL-SEEKING RECEIVER

Roy A. Gull, Kenmore, N. Y., assignor to Colonial Radio Corporation, Buffalo, N. Y.

Application June 7, 1946, Serial No. 674,965

5 Claims. (Cl. 250—40)

This invention relates to improvements in signal-seeking receivers, and more particularly to such receivers arranged to provide more accurate tuning to the incoming signal.

For the purposes of this specification, a signal-seeking receiver is defined as a receiver in which the tuning instrumentality is power driven, for instance by an electric motor, and when set into operation scans its tuning spectrum until an incoming signal of predetermined strength is tuned in.

At this point the incoming signal voltage operates a relay, through the medium of a control tube, which de-energizes the tuning motor and in addition may de-clutch the tuning motor from the tuning instrumentality and apply a brake to the tuning instrumentality so that the receiver remains tuned to the desired signal.

This action is purely automatic and requires no care or attention and no skill on the part of the operator. Also, if the apparatus is properly designed and constructed, it will tune the incoming signal more accurately than can possibly be done manually.

If the operator wishes to change to another station, all that is necessary is momentarily to operate a push button, which starts the tuner motor in operation, releases the brake, clutches the motor to the tuning instrumentality (if clutch and brake are employed), and the tuner will scan until another incoming signal of predetermined strength is received, whereupon the receiver de-energizes the motor and remains tuned to the particular signal until the operator again sets it in operation to look for another station.

In apparatus of the type heretofore proposed, it has been suggested to utilize a portion of the output of the intermediate frequency amplifier, which portion is then passed through a limiter, and the output of the limiter is then passed through a balanced tuned bridge circuit embodying a piezoelectric crystal tuned to the center frequency of the intermediate frequency band. The voltage from this tuned bridge circuit is then used to control a vacuum tube having a relay in its plate circuit, and this relay controls the tuner motor and the clutch and brake mechanism, if employed.

In such receivers it is customary always to tune in the same direction; that is, the motor always runs in the same direction; for instance, in a direction to scan the tuning spectrum from the low frequency end to the high frequency end. Usually some form of quick return motion is provided in the tuner drive so that when the tuner reaches the high frequency end of the spectrum, it snaps back very quickly to the low frequency end. An arrangement of this nature is disclosed in the Nicholson U. S. Patent No. 2,487,772, dated November 8, 1949, entitled "Signal-seeking receiver for AM and FM signals" and assigned to the same assignee as is this patent.

If this snap-back is sufficiently rapid, it is not necessary to mute the high-frequency signal translating channel of the receiver during the return period of the tuner as might otherwise be necessary to avoid premature termination of the receiver tuning on an undesired signal received during the return period. This is because there is not sufficient time for any signal which may be tuned in during the return stroke or "flyback" to build up to a sufficient energy level to operate the signal-seeking control system to stop the scanning. Generally the return or flyback takes place in about one-tenth of a second, whereas the scanning rate when the receiver is scanning for a signal is about 200 kc. per second.

In broadcast receivers which are usually built to cover a range from about 535 kc. to 1620 kc., the total scanning time for the receiver to tune from the low frequency end to the high frequency end is in the order of 5 seconds. Faster scanning is undesirable because the receiver may pass over a desired station while the operator has his finger on the starter button, and slower scanning is undesirable because of the excessive time required to travel from the low frequency to the high frequency end of the spectrum.

One difficulty which may be encountered in receivers of this type is mistuning resulting from failure of the apparatus to stop instantaneously when the incoming signal voltage reaches a level high enough to operate the relay to stop the motor. This results from inertia in the various movable parts, such as the relay, armature, the motor, and the clutch and brake mechanism, if clutch and brake are employed.

In general, a time interval of the order of about 2 milliseconds elapses between the time when the incoming signal voltage reaches a level sufficient to trip the relay and the time when the tuning instrumentality actually comes to rest. If the scanning occurs at the rate of 200 kc. per second, this results in the receiver being detuned from the desired signal by approximately 400 cycles.

In accordance with my invention, this difficulty is eliminated by tuning the control circuit, not to the exact center of the intermediate frequency band, but to a frequency lower than this by an amount equal to the number of cycles scanned per second multiplied by the time interval in seconds which the particular receiver requires between the time the signal voltage reaches a value sufficient to trip the relay and the time the tuning instrumentality actually comes to rest.

If the scanning is done from the high frequency to the low frequency end of the spectrum, the offset in frequency will be made higher than, instead of lower than, the center of the intermediate frequency band by the same amount. The result of this is that the control circuit is set into operation by a time which is just enough so that, when the tuning instrumentality has actually come to rest, it is tuned very closely to the desired signal frequency.

From the foregoing, it will be understood that it is an object of this invention to provide increased accuracy of tuning in a signal-seeking receiver.

It is a further object of this invention to provide for increased accuracy of tuning in such a receiver without the use of compensating circuits such as heretofore proposed.

It is a further object of this invention to provide increased accuracy of tuning in such a receiver without changing the constants of the oscillator circuit as has heretofore been proposed.

Still other objects and advantages of my invention will be apparent from the specification.

The features of novelty which I believe to be characteristic of my invention are set forth with particularity in the appended claims. My invention itself, however, both as to its fundamental principles and as to its particular embodiments, will best be understood by reference to the specification and accompanying drawing, in which The single figure is a circuit diagram of an improved signal-seeking receiver in accordance with my invention.

Referring now more particularly to the drawing, 10 represents an antenna of any suitable type, feeding radio frequency amplifier and converter 11, tuned by any suitable tuning instrumentality, herein indicated as gang condenser 11*a*. The output of the converter is then supplied to intermediate frequency amplifier 12 and thence to detector and audio amplifier 13 and loud speaker 14.

In accordance with the embodiment of the invention herein shown and described, and which will be understood to be merely by way of example, since other arrangements may be employed, a portion of the output of intermediate frequency amplifier 12 is impressed upon limiter 15. This may, and usually will, be a limiting amplifier tube having cathode 15*c*, control electrode 15*g*, screen 15*sc*, suppressor 15*sr*, and anode 15*a*.

Cathode 15*c* will usually be connected to ground through self-biasing resistor 16*b* shunted by bypass condenser 16*c*, and control electrode 15*g* is connected to ground through resistor 16*a*. Resistor 16*b* may be variable if desired, for the purpose of controlling the level of the incoming signal at which the receiver will stop scanning.

Anode 15*a* may be connected through primary winding 41 of tuned transformer 40 shunted by condenser 43 and through resistances 17 and 30 in series to the B+ source of supply, the negative side of this source being grounded as usual. Screen 15*sc* is connected to the B+ side of winding 41 and may be by-passed to ground through condenser 18. Suppressor 15*sr* is connected to cathode as usual.

The secondary winding 42 of transformer 40 may have one terminal connected to one terminal of piezoelectric crystal 20 and the other terminal connected through condenser 46 to the other terminal of crystal 20. Winding 42 may be shunted by condensers 44 and 45 in series, having their common terminal grounded.

The output of the tuned bridge circuit may be supplied to rectifier 22, which in this instance may be a triode connected as a diode, having cathode 22*c*, grid 22*g*, and anode 22*a*, the latter two being connected together and to the common terminal of crystal 20 and condenser 46.

Cathode 22*c* may be connected to ground through resistor 23 shunted by condenser 24, and may be also connected to B+ through resistor 25. Grid and anode 22*g* and 22*a* may be connected together, to ground through resistor 27, and through resistor 26 to control electrode 28*g* of tube 28, having cathode 28*c*, control electrode 28*g*, and anode 28*a*.

Anode 28*a* is connected through energizing winding 29*w* of relay 29 and through resistance 30 to B+. The stationary contact 29*f* of relay 29 may be connected to ground and the movable contact 29*a* of the relay is connected to stationary contact 34*f* of relay 34, the movable contact 34*a* of which may be connected through starter switch 35 to ground and also to one side of the tuning motor 32 having an armature 32*a* and field winding 32*f*. The energizing winding 34*w* of the relay 34 is connected across the motor armature 32*a*.

The other side of the motor armature and field winding may be connected through a suitable source of current 31 to ground.

In accordance with my invention, the tuned bridge circuit is tuned off the center frequency of the intermediate frequency band by an amount which is equal to the product of the scanning rate in cycles per second multiplied by the time in seconds required for the tuning instrumentality to come to a standstill after the signal voltage reaches a value sufficient to operate relay 29.

If the scanning is from the low frequency end to the high frequency end, the detuning will be in the direction of the low frequency, and if the scanning is from the high frequency end toward the low frequency end, the detuning will be in the direction of the high frequency.

For example, if the receiver is designed to scan from low to high frequency at a rate of 200 kc. per second and the stopping time of the tuning instrumentality is 5 milliseconds after the signal voltage reaches a value sufficient to trip relay 29 and if the intermediate frequency is 455 kc., then the tuned bridge circuit will be detuned 1,000 cycles toward the low frequency end of the spectrum, and the bridge circuit and crystal will be tuned to 454.0 kc. If everything else is the same, and the receiver is designed to scan from the high frequency end to the low frequency end of the spectrum, the tuned bridge circuit would then be tuned to 456.0 kc.

In some receivers, instead of a tuned bridge circuit, a so-called frequency discriminator network is employed to operate the control circuit. My invention may be applied to such receivers in the same way as herein described, the cross-over point of the discriminator being detuned from the center of the intermediate frequency band by the same amount herein prescribed; i. e., the scanning rate in kc. per second multiplied by the time in seconds required for the tuning instrumentality to stop moving after the incoming signal voltage becomes sufficient to trip the relay.

Operation of the apparatus will now be described. Assuming that the tubes are lighted and have warmed up, and also that the receiver is tuned to an incoming signal of predetermined strength, piezoelectric crystal 20 is tuned as already described; intermediate frequency currents delivered to rectifier tube 22 will be impressed upon the grid of control tube 28, biasing it negatively to or nearly to cutoff; and relay 29 will be open. The motor circuit is, therefore open, and the receiver will remain tuned to the incoming signal.

If the operator wishes to select another station, he will momentarily close switch 35. This closes the motor circuit independently of relays 29 and 34 and causes the tuning instrumentality to start scanning. As soon as motor 32 is energized, relay 34 is likewise energized and closes its contacts 34a and 34f, no output of the intermediate frequency amplifier is impressed on tube 15, no currents are rectified by tube 22, the bias on tube 28 due to incoming signals disappears, and that tube begins to draw normal plate current which is sufficient to close relay 29.

Since relay 34 is already closed, this completes the motor circuit through relays 29 and 34, the latter being locked in, and the operator may now release switch 35, permitting it to open, without stopping the motor. The receiver will continue to scan until the next signal of predetermined strength is tuned in, at which time tube 15 again impresses intermediate frequency currents through crystal 20 on rectifier 22, which in turn biases tube 28 to a point where relay 29 opens, thereby de-energizing the motor circuit and bringing the tuning instrumentality 11a to a stop.

As already pointed out, because of the tuning of the bridge circuit to a frequency removed from the intermediate frequency by an amount necessary to provide compensation for the stopping time of the tuner, the process of stopping begins just sufficiently ahead of the correct tuning position so that the inertia of the system causes it to coast to the exact tuning position, giving an accuracy of tuning which is much greater than even a skilled operator can obtain manually, and at the same time requiring no compensation circuits in the converter, as heretofore employed.

In the specifications I have explained the principles of my invention and the best mode in which I have contemplated applying those principles, so as to distinguish my invention from other inventions; and I have particularly pointed out and distinctly claimed the part, improvement, or combination which I claim as my invention or discovery.

While I have shown and described certain preferred embodiments of my invention, it will be understood that modifications and changes may be made without departing from the spirit and scope thereof, as will be clear to those skilled in the art.

I claim.

1. A signal-seeking superheterodyne receiver having a variable tuning instrumentality, power operated means for varying said tuning instrumentality, manual means for causing said power means to vary said tuning instrumentality, and means for causing tuning in of a signal of predetermined strength to stop variation of said tuning instrumentality, said last mentioned means comprising a frequency selective circuit tuned to the middle frequency of the intermediate frequency band plus or minus the number of cycles by which the tuning of the receiver changes in the interval between the time when an incoming signal voltage reaches a value sufficient to stop the tuning variation and the time when the tuning instrumentality stops varying.

2. A signal-seeking superheterodyne receiver having a variable tuning instrumentality, power operated means for varying said instrumentality, manual means for causing said power means to vary said tuning instrumentality, and means for causing tuning in of a signal of predetermined strength to stop variation of said tuning instrumentality, said receiver being arranged to scan its spectrum always in the same direction when seeking signals, and said last mentioned means comprising a frequency selective circuit detuned from the middle frequency of the intermediate band by the number of cycles by which the tuning of the receiver changes in the interval between the time when an incoming signal voltage reaches a value sufficient to stop the tuning variation and the time when the tuning instrumentality stops varying, said detuning being in the opposite sense from the sense in which said receiver scans its spectrum.

3. A signal-seeking superheterodyne receiver having a variable tuning instrumentality, power operated means for varying said instrumentality, manual means for causing said power means to vary said tuning instrumentality, and means for causing tuning in of a signal of predetermined strength to stop variation of said tuning instrumentality, said last mentioned means comprising a frequency selective circuit tuned to a frequency of the order of the middle frequency of the intermediate frequency band but differing therefrom by an audible frequency.

4. A signal-seeking superheterodyne receiver having a variable tuning instrumentality, power operated means for varying said instrumentality, manual means for causing said power means to vary said tuning instrumentality, and means for causing tuning in of a signal of predetermined strength to stop variation of said tuning instrumentality, said last mentioned means comprising a frequency selective circuit tuned to a frequency of the order of the middle frequency of the intermediate frequency band but differing therefrom by a relatively low frequency.

5. A signal-seeking superheterodyne receiver having a variable tuning instrumentality, power-operated means for varying said tuning instrumentality, and a control system responsive to the reception of a signal of predetermined strength to stop variation of said tuning instrumentality, said system including a piezoelectric crystal resonant at a frequency differing from the mean frequency of the intermediate-frequency pass band of said receiver by the number of cycles by which the tuning of the receiver changes in the interval between the time when the received-signal voltage reaches a value sufficient to effect deenergization of said power-operated means and the time when the tuning instrumentality comes to rest.

ROY A. GULL.

REFERENCES CITED

The following references are of record in the file of this patent:

UNITED STATES PATENTS

| Number | Name | Date |
|---|---|---|
| 2,044,645 | Stapleton et al. | June 16, 1936 |
| 2,056,200 | Lowell | Oct. 6, 1936 |
| 2,218,905 | Cooper | Oct. 22, 1940 |
| 2,369,542 | Dietrich | Feb. 13, 1945 |

OTHER REFERENCES

Wireless World, Oct. 18, 1935, Article "Aerodyne Aeromagic" receiver, pages 420–422.